United States Patent [19]

Klara et al.

[11] Patent Number: 5,276,363
[45] Date of Patent: Jan. 4, 1994

[54] ZERO POWER DECODER/DRIVER

[75] Inventors: Walter S. Klara, Hopewell Junction; Frank A. Montegari, Wappingers Falls, both of N.Y.

[73] Assignee: International Business Machines Corporation, Armonk, N.Y.

[21] Appl. No.: 929,260

[22] Filed: Aug. 13, 1992

[51] Int. Cl.⁵ .................. H03K 19/082; G11C 8/00
[52] U.S. Cl. .................. 307/463; 365/230.06; 307/455
[58] Field of Search .......... 307/455, 475, 463; 365/230.06, 189.11

[56] References Cited

U.S. PATENT DOCUMENTS

| | | | |
|---|---|---|---|
| 4,195,358 | 3/1980 | Yuen | 365/230 |
| 4,348,747 | 9/1982 | Takahashi | 365/230 |
| 4,349,895 | 9/1982 | Isogai | 365/230 |
| 4,394,657 | 7/1983 | Isogai et al. | 340/825 |
| 4,394,752 | 7/1983 | Boudon et al. | 365/227 |
| 4,490,630 | 12/1984 | Freeman | 307/455 |
| 4,494,017 | 1/1985 | Montegari | 307/463 |
| 4,578,779 | 3/1986 | Chan | 365/230.06 |
| 4,857,772 | 8/1989 | Herndon | 307/463 |
| 4,986,666 | 1/1991 | Homma et al. | 365/230 |
| 5,021,688 | 6/1991 | Leforestier et al. | 307/463 |
| 5,022,010 | 6/1991 | Chan | 307/463 |

OTHER PUBLICATIONS

"Three Level Decoding Scheme for High Density Arrays," IBM Technical Disclosure Bulletin, vol. 29, No. 7, Dec. 1986.

Primary Examiner—Edward P. Westin
Assistant Examiner—Andrew Sanders
Attorney, Agent, or Firm—Whitham & Marhoefer

[57] ABSTRACT

A zero power decoder/driver circuit for high performance array chips dissipates zero power when in the deselected state. The decoder/driver circuit is a complementary bipolar circuit comprising a first bipolar transistor of a first conductivity type having its base connected to a down level decoded output of a first level decoder and its emitter connected to an up level decoded output of said first level decoder. The decoder/driver circuit is selected by a predetermined voltage differential across the base/emitter circuit of the first transistor. A diode-connected second bipolar transistor of a second conductivity type is connected to the collector of said first bipolar transistor. A line driver third bipolar transistor of the second conductivity type is connected to a load resistor and mirrors current flowing in said second bipolar transistor. When the second state decoder is deselected, no current flows in the second bipolar transistor of second conductivity type and, therefore, no current is mirrored into the third bipolar transistor of second conductivity type, thus resulting in zero power dissipation. Since only one word line and one bit column are selected at a time, total power dissipation can be substantially reduced.

3 Claims, 4 Drawing Sheets

ZERO POWER DECODER/DRIVER

BACKGROUND OF THE INVENTION

1. Field of the Invention

The present invention generally relates to high performance array chips, such as random access memories, and, more particularly, to an improved decoder/driver circuit which reduces the overall chip power.

2. Description of the Prior Art

High performance array chips, such as Static Random Access Memories (SRAMs) and Dynamic Random Access Memories (DRAMs), are being fabricated in ever higher densities. Power dissipation in array word line and bit column decoder/driver circuits is a critical problem because their power dissipations can be a large portion of the total chip power. It is therefore important to minimize overall chip power in these high performance array chips.

SUMMARY OF THE INVENTION

It is therefore an object of the present invention to provide a lower power word decoder for high performance arrays, such as random access memories (RAMs).

It is another object of the invention to provide a decoder/driver circuit which reduces overall chip power in a normally high power area of the chip.

According to the invention, there is provided a zero power decoder/driver circuit which dissipates zero power when in the deselected state. The decoder/driver circuit is a complementary bipolar circuit comprising a first bipolar transistor of a first conductivity type having its base connected to a down level decoded output of a first level decoder and its emitter connected to an up level decoded output of said first level decoder. The decoder/driver circuit is selected by a predetermined voltage differential across the base/emitter circuit of the first transistor. A diode-connected second bipolar transistor of a second conductivity type is connected to the collector of said first bipolar transistor. A line driver third bipolar transistor of the second conductivity type is connected to a load resistor and mirrors current flowing in said second bipolar transistor. When the second stage decoder is deselected, no current flows in the second bipolar transistor of second conductivity type and, therefore, no current is mirrored into the third bipolar transistor of second conductivity type, thus resulting in zero power dissipation. Since only one word line and one bit column are selected at a time, total power dissipation can be substantially reduced in the decoder/drivers designed for driving the word and bit lines of a high performance array.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
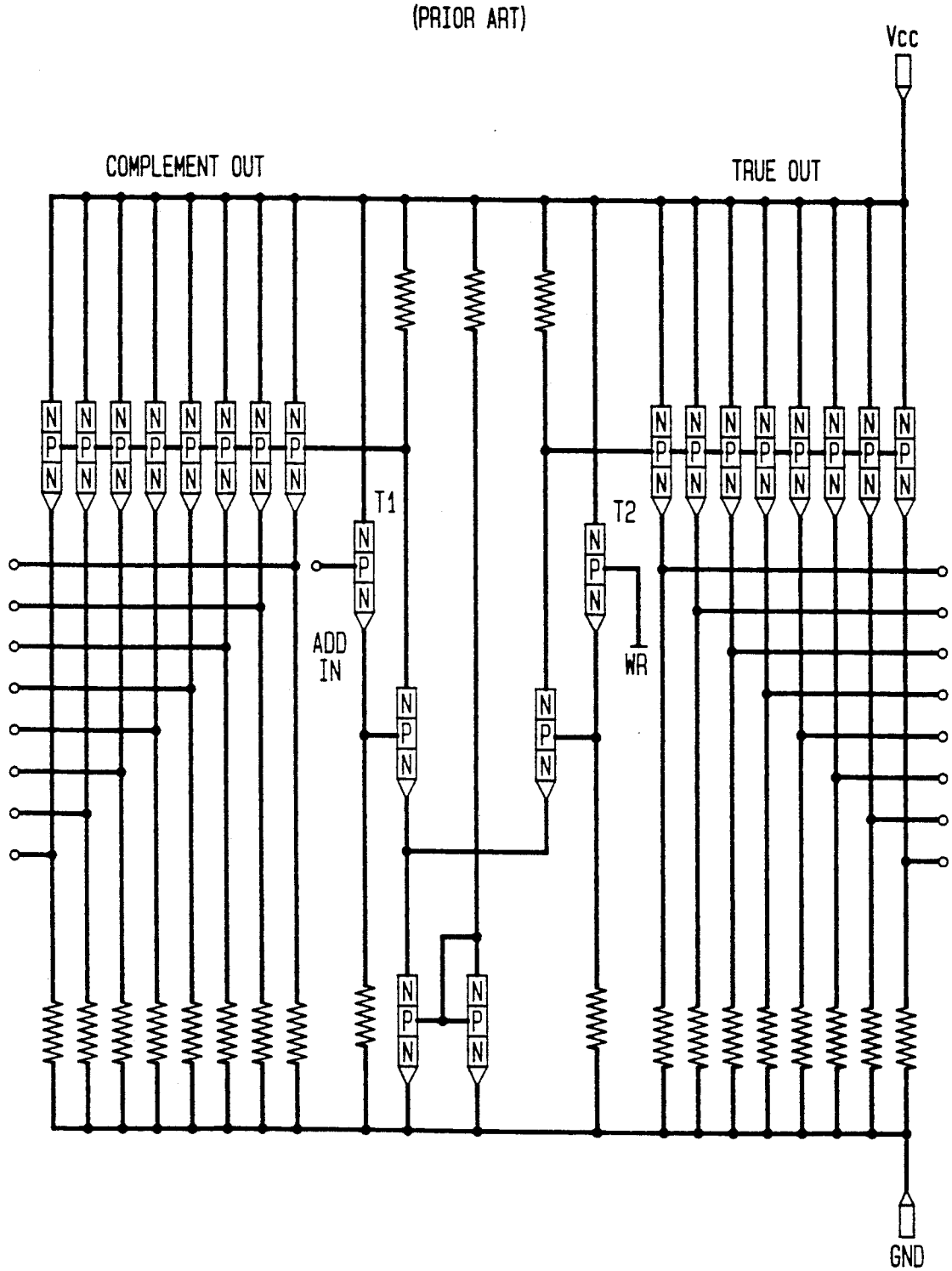
FIG. 1 is a schematic diagram of a conventional true/complement generator (TCG)

Referring now to the drawings, and more particularly to FIG. 1, there is shown a schematic diagram of a typical True/Complement Generator (TCG) circuit having eight true and eight complement emitter follower outputs. In this circuit, the input is applied to a first NPN transistor T1 connected as an emitter follower. A second NPN transistor T2, also connected as an emitter follower, receives a reference voltage VR. These two transistors drive a differential pair of NPN transistors which, in turn, drive respective groups of eight NPN transistors connected as emitter followers to supply eight true and complement outputs. Circuits of this type are used in groups of four to decode four lines into sixteen lines.

Figure 2:
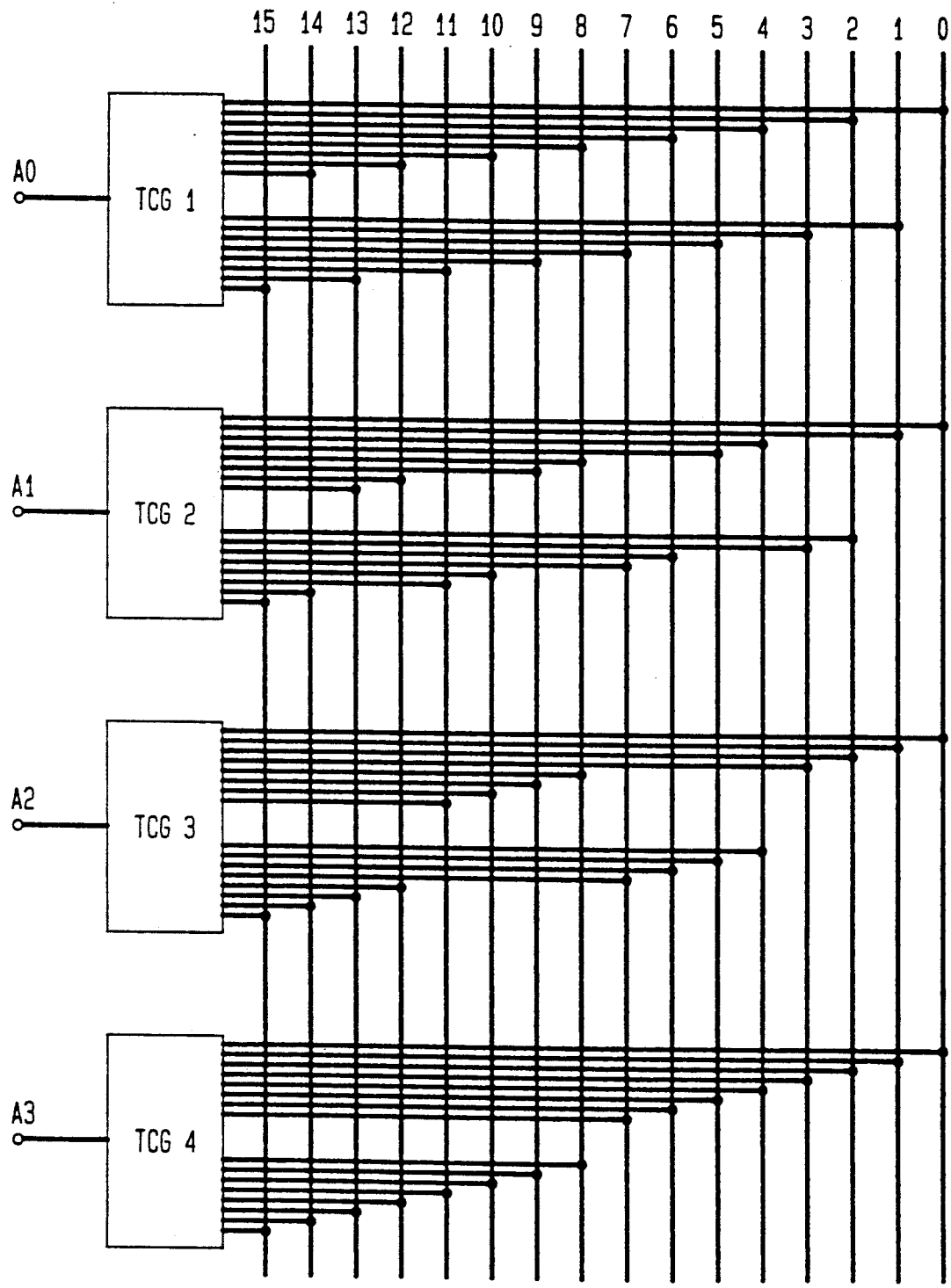
FIG. 2 is a block diagram of four conventional true/complement generators (TCGs) configured as a four line to sixteen line decoder.

FIG. 2 is a block diagram of four True/Complement Generators (TCGs) with their output emitter followers dotted together to perform the first decoding function and drive the metallurgy lines that feed their second decoder loads. These four TCGs receive four binary inputs on lines A0 to A3 and decode these four lines into the sixteen lines numbered 0 to 15.

Figure 3:
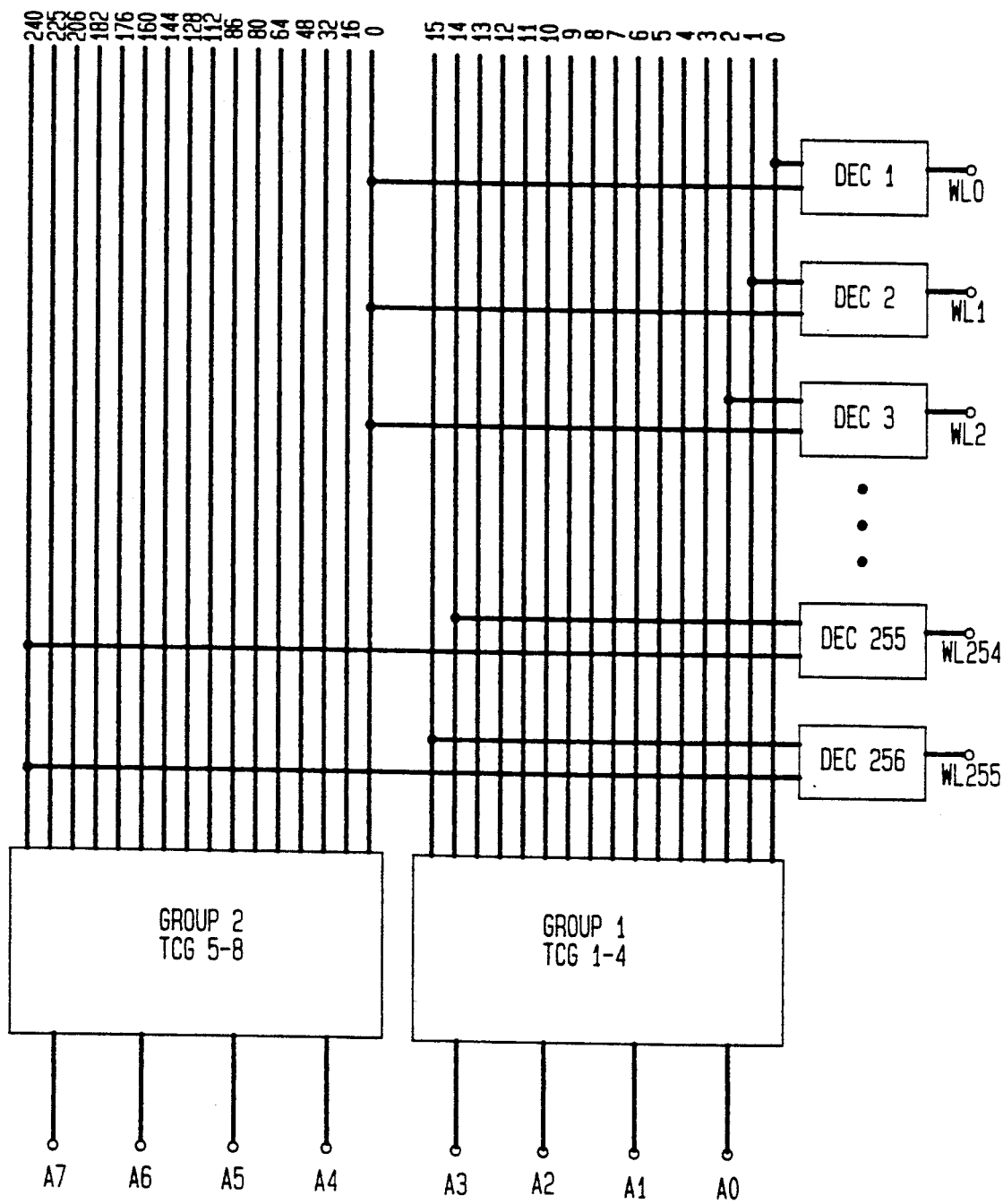
FIG. 3 is a block diagram showing two groups of the conventional true/complement generators (TCGs) driving dual-input second decoders that decode into 256 word lines.

Two groups of four TCGs each can decode eight lines into thirty-two lines which can be further decoded by dual-input second decoders into 256 word or bit lines that connect to the memory cells of an array as shown in FIG. 3. Each TCG in group 1 has eight true and eight complement NPN emitter followers that are dotted with those of the other TCGs in the group, thus producing the well known AND function first stage decoder that supplies a down level decoded output. Each TCG in group 2 has eight true and eight complement PNP emitter followers that are dotted with those of the other TCGs in the group, thus producing an OR function first stage decoder that supplies an up level decoded output. The emitter follower pulldowns in group 1 and pullups in group 2 are preferably current sources that supply a constant current at different voltage levels to provide better control of the current that is fed into the decoder/driver circuits that are driven by these circuits.

Figure 4A:
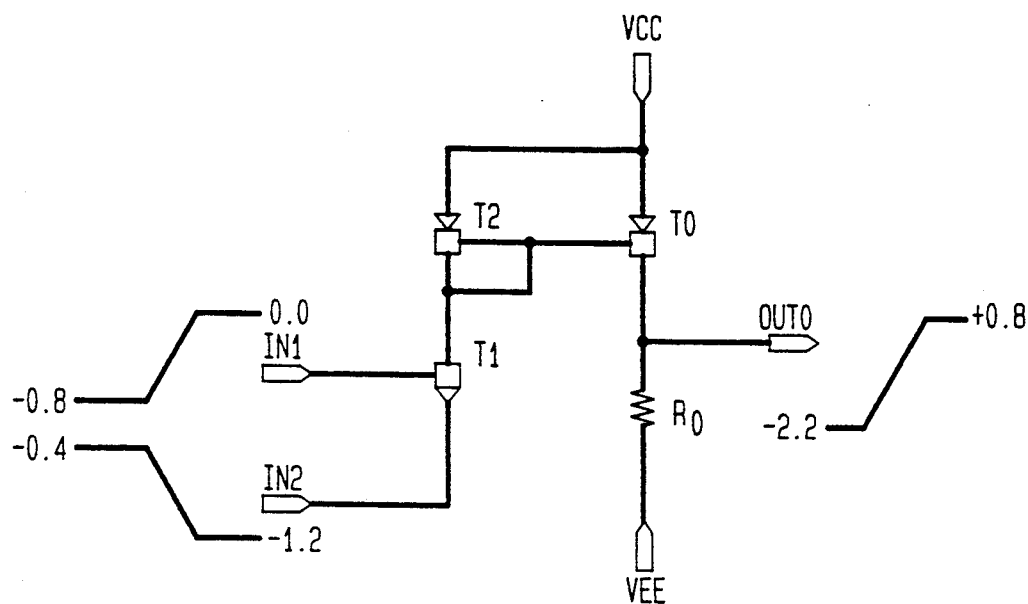
FIGS. 4a and 4b are schematic diagrams showing two versions of the zero power decoder/driver according to the invention.
Figure 4B:
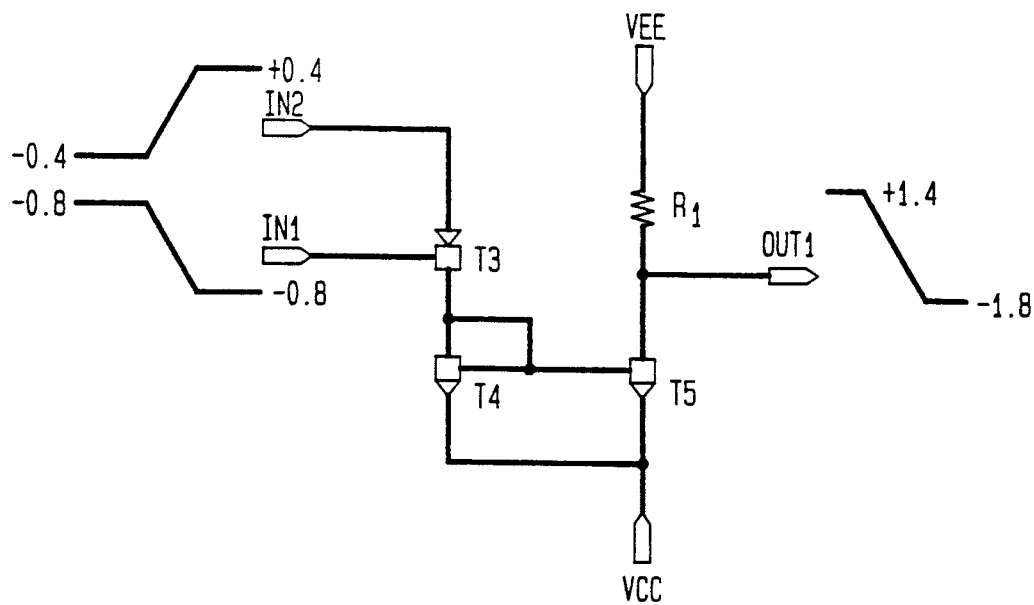

FIGS. 4a and 4b show two versions of the zero power decoder/driver according to the invention, one producing an up level decoded output for driving array word and bit lines, and the other producing a down level decoded output that is useful in some bit line and special applications.

In FIG. 4a, an output line from the group 1 TCG feeds the emitter of NPN transistor T1 and an output line from group 2 feeds its base. A decoder/driver is selected when the base of transistor T1 is pulled up and its emitter is pulled down simultaneously. A decoder is deselected if its base is down or its emitter is up, or if both its base is down and its emitter is up. When the base of NPN transistor T1 is up and its emitter is down, current flows from diode connected PNP transistor T2 into the collector of transistor T1, and transistor T2 mirrors its current into PNP inverting line driver transistor T0. A load resistor R0 connected from the collector of transistor T0 to $V_{EE}$ pulls the word line down when the decoder/driver is deselected. The value of the load resistor R0 is chosen to provide an adequate signal swing but to also limit the up level to prevent transistor T0 from saturating.

In FIG. 4b, an output line from the group 1 TCG feeds the base of PNP transistor T3 and an output line from group 2 feeds its emitter. A second decoder is selected when the emitter of transistor T3 is pulled up and its base is pulled down simultaneously. A decoder is deselected if its emitter is down or its base is up or if both its emitter is down and its base is up. When the emitter of transistor T3 is up and its base is down, current flows from the collector of transistor T3 into diode connected NPN transistor T4 which mirrors its current into NPN inverting line driver transistor T5. A load resistor R1 connected from $V_{CC}$ to the collector of transistor T5 pulls the line up when the decoder/driver is deselected.

The decoder/driver circuit according to the invention dissipates no power when deselected. Zero power of deselected decoders means high power can be dissipated in the selected decoder for very high performance. In a specific application, the power dissipated in second decoders can be reduced by almost an order of two magnitude using the zero power decoder/driver circuits of this invention. In addition to these advantages, the decoder/driver circuits of the invention produce large voltage transitions at word and bit line outputs. All this is accomplished in a simple circuit design of few components facilitating high density physical design.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A zero power decoder/driver circuit for high performance array chips comprising:
   a first bipolar transistor of a first conductivity type having its base connected to a first decoded output of a first level decoder and its emitter connected to a second decoded output of said first level decoder, said decoder/driver circuit being selected by a predetermined voltage differential across the base/emitter circuit of said first transistor;
   a diode-connected second bipolar transistor of a second conductivity type opposite said first conductivity type connected to the collector of said first bipolar transistor; and
   a line driver third bipolar transistor of said second conductivity type connected to a load resistor and mirroring current flowing in said second bipolar transistor, with power being dissipated only when the first bipolar transistor of first conductivity type is selected and zero when not selected.

2. The zero power decoder/driver circuit recited in claim 1 wherein said first bipolar transistor is an NPN transistor and said second and third bipolar transistors are PNP transistors, said first level decoded output being a down level and said second level decoded output being an up level, said decoder/driver circuit being selected when the base of said first transistor is pulled up and its emitter is pulled down simultaneously.

3. The zero power decoder/driver circuit recited in claim 1 wherein said first bipolar transistor is a PNP transistor and said second and third bipolar transistors are NPN transistors, said first level decoded output being a down level and said second level decoded output being an up level, said decoder/driver circuit being selected when the emitter of said first transistor is pulled up and its base is pulled down simultaneously.

* * * * *